United States Patent
Gardner et al.

(10) Patent No.: US 6,228,724 B1
(45) Date of Patent: May 8, 2001

(54) METHOD OF MAKING HIGH PERFORMANCE MOSFET WITH ENHANCED GATE OXIDE INTEGRATION AND DEVICE FORMED THEREBY

(75) Inventors: Mark I. Gardner, Cedar Creek; Thomas E. Spikes, Round Rock; H. Jim Fulford, Jr., Austin, all of TX (US)

(73) Assignee: Advanced Mirco Devices, Sunnyvale, CA (US)

( * ) Notice: Subject to any disclaimer, the term of this patent is extended or adjusted under 35 U.S.C. 154(b) by 0 days.

(21) Appl. No.: 09/238,826

(22) Filed: Jan. 28, 1999

(51) Int. Cl.$^7$ .................................................. H01L 21/336
(52) U.S. Cl. ........................ 438/287; 438/591; 438/592; 438/664
(58) Field of Search ....................... 438/216, 287, 438/303, 305, 306, 307, 591, 592, 655, 656, 664, 682, 683

(56) References Cited

U.S. PATENT DOCUMENTS 5,162,884 * 11/1992 Liou et al. ............................ 438/591
5,464,783 * 11/1995 Kim et al. ............................ 438/287
5,668,028 * 9/1997 Bryant ................................. 438/287

* cited by examiner

Primary Examiner—Chandra Chaudhari
(74) Attorney, Agent, or Firm—Bruce Garlick; James Harrison

(57) ABSTRACT

Transistors formed according to the present invention include an oxide layer/nitride layer gate insulator and a silicide gate conductor. An oxide layer is formed to a thickness of between 15 and 25 Angstroms across a substrate and partially removed so that a thickness of approximately 4 Angstroms remains. A nitride layer is formed upon oxide layer to a thickness of 10 to 20 Angstroms. Polysilicon gate conductors are then formed above the active regions of the substrate using a deposition and patterning technique. Spacers are then formed about the polysilicon gate conductor, lightly doped drain regions are formed and then source/drain regions are formed. In forming the lightly doped drain regions and the source/drain regions, the polysilicon gate conductor is doped. Then, a silicidation metal layer is deposited upon the polysilicon gate conductors and exposed portions of the nitride layer. The resultant structure is then subjected to an annealing step in which the polysilicon gate conductor is converted to a silicide gate conductor having a relatively lower bulk resistance. The remaining portions of the silicide metal layer are removed. Openings are then made to the source/drain regions through which interconnections are made to the transistor. A plurality of transistors formed according to this technique may be interconnected to form an integrated circuit.

12 Claims, 5 Drawing Sheets

METHOD OF MAKING HIGH PERFORMANCE MOSFET WITH ENHANCED GATE OXIDE INTEGRATION AND DEVICE FORMED THEREBY

BACKGROUND

1. Field of the Invention

The present invention relates generally to integrated circuit manufacture; and more particularly to a method and structure in which a gate conductor is formed of a polysilicon material that has been converted to a silicide and in which a sandwiched gate insulator provides protection for a self-aligned channel region.

2. Description of the Related Art

The structure and the various components, or features, of a metal oxide semiconductor (MOS) device are generally well known. A MOS transistor typically includes a substrate material onto which a gate insulator and a patterned gate conductor are formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate comprises an entire monolithic silicon wafer, in which, a portion of the substrate known as a "well" is formed. The well is doped opposite the substrate so that it can accommodate junctions of an impurity type opposite the junction in the non-well areas. Accordingly, wells are often employed when both n-type and p-type transistors (i.e. Complementary MOS, "CMOS") are needed.

A pervasive trend in modern integrated circuit manufacture is to produce transistors having feature sizes as small as possible. To achieve a high density integrated circuit, features such as the gate conductor, source/drain junctions, and interconnects to the junction must be made as small as possible. Many modern day processes employ features which have less than 0.25 micron critical dimensions. As feature size decreases, the resulting transistor as well as the interconnect between transistors also decreases. Smaller transistors allow more transistors to be placed on a single monolithic substrate, thereby allowing relatively large circuit systems to be incorporated on a single and relatively small die area. Further, smaller transistors typically have lower turn-on threshold voltages, faster switching speeds and consume less power in their operation. These features in combination allow for higher speed integrated circuits to be constructed that have greater processing capabilities.

The benefits of high density circuits can only be realized if advanced processing techniques are used. For example, semiconductor process engineers and researchers often study the benefits of electron beam lithography and x-ray lithography to achieve the higher resolutions needed for submicron features. To some extent, wet etch has given way to a more advanced anisotropic (dry etch) technique. Further, silicides and polycides have replaced higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot, in all instances, offset the problems associated with the use of small features or features arranged extremely close to one another. For example, as the channel length decreases, short channel effects ("SCE") generally occur. SCE cause threshold voltage skews at the channel edges as well as excessive sub-threshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric fields give rise to so called hot carriers and the injection of these carriers into the gate oxide which resides between the substrate (or well) and the overlying gate conductor. Injection of hot carriers should be avoided since these carriers can become trapped and skew the turn-on threshold voltage of the ensuing transistor.

Another particular problem relating to the scaling of transistors is found in the formation of transistor gate dielectrics and gate conductors. In order to produce a scaled transistor, the gate dielectrics and gate conductors must be formed with less width and less thickness. Gate dielectrics are typically formed of silicon dioxide which is grown on the surface of active regions of the substrate. When transistors are scaled, the gate dielectric thickness must be reduced accordingly. However, when the silicon dioxide gate dielectric is less than approximately 10 Angstroms thick, it fails to function properly. Thus, a limitation exists in the use of silicon dioxide, or other similar materials as gate dielectrics in scaled transistors.

Further, the gate conductor must also be reduced in width to correspond to the reduced width of the gate dielectric. With its reduced dimensions, the resistance of the gate conductor increases. Thus, the gate conductor is typically heavily doped to increase its conductivity so that the transistor will function properly. However, the dopant in the gate conductor tends to migrate into and through the gate dielectric, thereby depleting the dopant near the gate dielectric. This migration of dopant is referred to as the "polysilicon depletion effect" and results in altered turn-on threshold voltages and poor transistor performance.

Thus, there exists a need in the art for an improved gate conductor/gate dielectric structure that will minimize the problems resulting from transistor scaling.

SUMMARY OF THE INVENTION

The problems outlined above are in large part solved by transistors and an integrated circuit formed according to the present invention. In forming such transistors, active regions and isolation regions are formed in a substrate. Wells may also be formed so that differing types of transistors may be formed in a single substrate. With the active regions and isolation regions formed, an oxide layer is formed to a thickness of between 15 and 25 Angstroms across the substrate and partially removed so that a thickness of approximately 4 Angstroms remains. Then a nitride layer is formed upon oxide layer to a thickness of 10 to 20 Angstroms. Polysilicon gate conductors are then formed above the active regions of the substrate using a deposition and patterning technique.

Spacers are then formed about the polysilicon gate conductor, lightly doped drain regions are formed and then source/drain regions are formed. In forming the lightly doped drain regions and the source/drain regions, the polysilicon gate conductor is doped. Then, a silicidation metal layer is deposited upon the polysilicon gate conductors and exposed portions of the nitride layer. The resultant structure is then subjected to an annealing step in which the polysilicon gate conductor is converted to a silicide gate conductor having a relatively lower bulk resistance.

With the conversion complete, the remaining portions of the silicide metal layer are removed. Openings are then made to the source/drain regions through which interconnections are made to the transistor. A plurality of transistors formed according to this technique may be interconnected to form an integrated circuit.

Silicidation of the source/drain regions may be accomplished using differing techniques according to the present invention. Using a first technique, silicidation of the source/drain regions is performed after portions of the oxide layer and nitride layer residing upon the source/drain regions have been removed. Alternately, an aggressive silicidation metal, e.g., titanium, may be employed which will form silicidation of the source/drain regions during conversion of the polysilicon gate conductor to the silicide gate conductor.

By forming the oxide layer/nitride layer gate insulator, dopant migration from the polysilicon gate conductor to the oxide layer and the channel is precluded. Further, by converting the polysilicon gate conductor to a silicide gate conductor, the bulk resistance of the gate conductor is decreased and thus allows for further transistor scaling.

Moreover, other aspects of the present invention will become apparent with further reference to the drawings and specification which follow.

BRIEF DESCRIPTION OF THE DRAWINGS

A better understanding of the present invention can be obtained when the following detailed description is considered in conjunction with the following drawings, in which.

DETAILED DESCRIPTION OF THE DRAWINGS

Figure 1A:
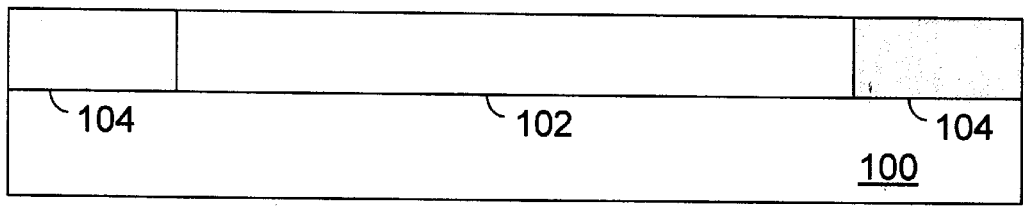
FIGS. 1A through 1D are partial cross-sectional views of a semiconductor substrate during the formation of a transistor according to the present invention.

FIGS. 1A through 1D are partial cross-sectional views of a semiconductor substrate during the formation of a transistor according to the present invention. Referring now to FIG. 1A, a substrate 100 includes an active region 102 and a plurality of isolation regions 104. In general, FIG. 1A represents a substrate after a first step of integrated circuit fabrication process as described herein is performed. The active region 102 is a semiconductive region in which an active device may be formed. The isolation regions 104 are formed of an insulating material which serves to isolate active devices or conductive components from other active devices or conductive components.

For silicon based semiconductor circuits, the isolation regions 104 are typically formed of silicon dioxide. The isolation regions 104 may be formed using the well known LOCOS growth process, trenching and filling steps or another isolation process. In general, the invention herein includes all forms of creating isolation regions.

The active region 102 illustrated is one of many that are formed in the substrate 100 in which transistors and other active devices are formed, such devices later interconnected to form an integrated circuit. The substrate 100 may be formed of an n-type or a p-type material, depending upon the particular embodiment. P-channel transistors are formed in n-type material while n-channel transistors are formed in p-type material. Thus, in a CMOS embodiment, wells are also formed in the substrate 100. These wells may be formed prior to or after formation of the active regions 102 and isolation regions 104. However, as will become evident of one skilled in the art, the wells may also be formed later in the process. Such processes are known in the art and are not described further herein. $V_T$ regions may also be formed in the active regions 102 to set the turn-on voltage of the subsequently formed transistors. Formation of such $V_T$ regions is also generally known.

Figure 1B:
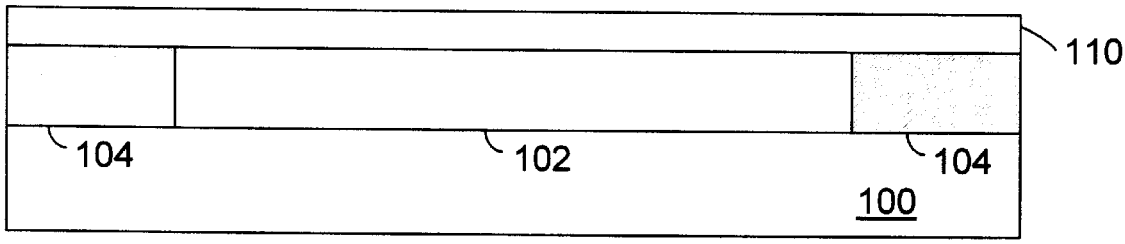

Referring now to FIG. 1B, it may be seen that an oxide layer 110 has been formed upon the active region 102 and isolation regions 104 of the substrate. In the described embodiment, the oxide layer 110 comprises $SiO_2$ that has been grown to a depth of between 15 and 25 Angstroms. In other embodiments, however, the oxide layer 104 may be deposited instead of being grown. In either case, after being formed to a thickness of between 15 and 25 Angstroms, the oxide layer 110 is partially removed such that it has a thickness of approximately 4 Angstroms.

Figure 1C:
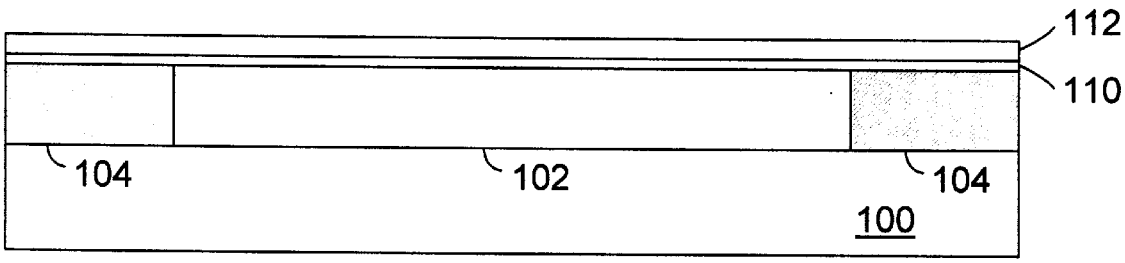

FIG. 1C illustrates the oxide layer 104 after it has been partially removed, uniformly across its surface, so that it has a thickness of approximately 4 Angstroms. In the described embodiment, the oxide layer 110 is subjected to a wet etch dip process in which the oxide layer 110 is exposed to a HF liquid diluted with water to a concentration of 100 parts water to 1 part HF. Such a solution slowly removes the oxide layer 110 so that the removal may be precisely controlled to reach the desired final thickness of the oxide layer 110. Of course, other techniques may be employed to reduce the thickness of the oxide layer 110.

FIG. 1C also illustrates the substrate after a nitride layer 112 has been formed upon the oxide layer 110. In the described embodiment, the nitride layer 112 is deposited in a low pressure chemical vapor deposition process (LPCVD) to form an $Si_3N_4$ nitride layer. After formation, the thickness of the nitride layer 112 is between 10 and 20 Angstroms. With an equivalent dielectric constant of 8, the nitride layer 112 therefore is equivalent to a 5 to 10 Angstrom thick layer of $SiO_2$. In other embodiments, the nitride layer 112 may be formed using a plasma deposition process, a sputtering process or another process capable of uniformly depositing the nitride layer 112. In still another embodiment, the nitride layer 112 is initially formed at a greater thickness and etched back to produce the thickness of between 10 and 20 Angstroms.

Once the nitride layer 112 is formed upon the substrate, the resulting structure may be annealed to passivate the nitride layer 112. In the described embodiment, a rapid thermal annealing step is performed at 700 to 950 degrees Celsius for 30 to 90 seconds in an $NH_3$ atmosphere to passivate the nitride layer 112.

Figure 1D:
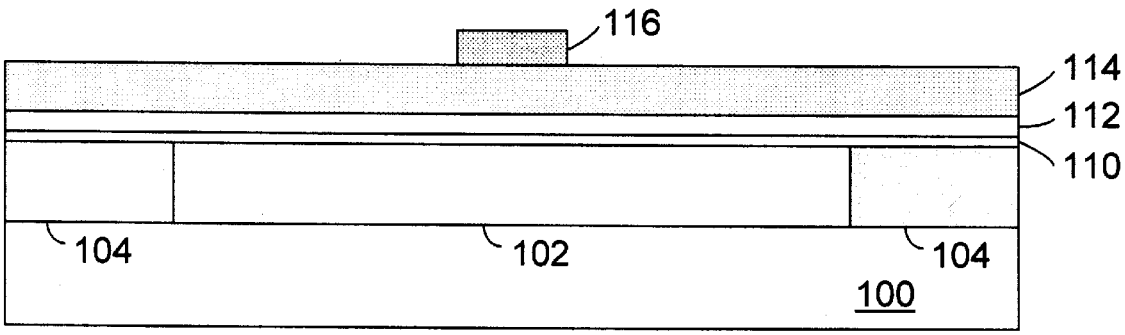

FIG. 1D illustrates the substrate 100 after additional steps in the manufacturing process are performed. In a first step of the additional steps, a polysilicon layer 114 is deposited uniformly across the surface of the substrate upon the nitride layer 112. The polysilicon layer 114 is deposited in a vapor deposition process step to a depth that is proportionate to the size of the resulting gate conductor to be formed, in the range of 1500 Angstroms for the present embodiment. In other embodiments, the polysilicon layer 114 may be thicker or thinner.

Once the polysilicon layer 114 is formed upon the nitride layer 112, the polysilicon layer 114 is pattern masked to define the gate conductor of a transistor being formed. In such operation, a photoresist layer is applied upon the polysilicon layer 114 and selectively exposed in a lithographic process. Then, exposed portions of the photoresist layer are removed in an etching or ashing process such that patterned mask 116 remains. As shown, the patterned mask 116 is formed so that it is substantially centered above the active region 102 in which other transistor components will be formed.

Figure 2A:
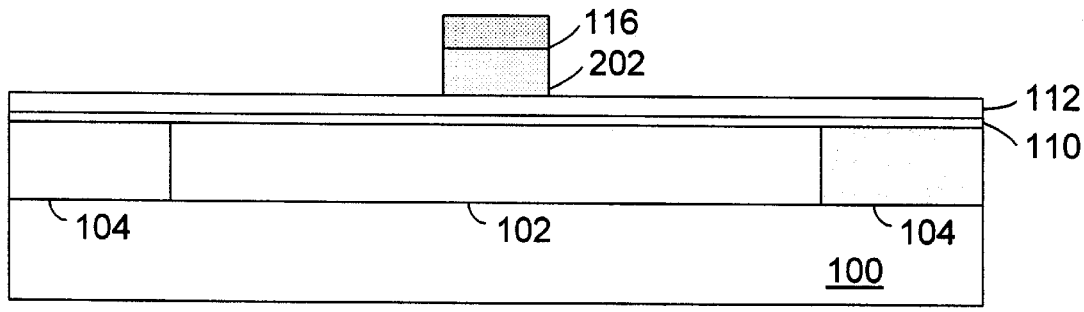
FIGS. 2A through 2D are additional partial cross-sectional views of the semiconductor substrate of FIGS. 1A through 1D during the formation of the transistor according to present invention.

FIGS. 2A through 2D are additional partial cross-sectional views of the semiconductor substrate of FIGS. 1A through 1D during the formation of the transistor according to present invention. Referring now to FIG. 2A, the substrate 100 is illustrated after an etching step has been performed to remove portions of the polysilicon layer 114 unprotected by the patterned mask 116. As shown, after the etching step, the nitride layer 112 has been exposed so that a gate conductor 202 is formed above the active region 102. Subsequently, the patterned mask 116 is removed so that the gate conductor 202 remains.

Figure 2B:
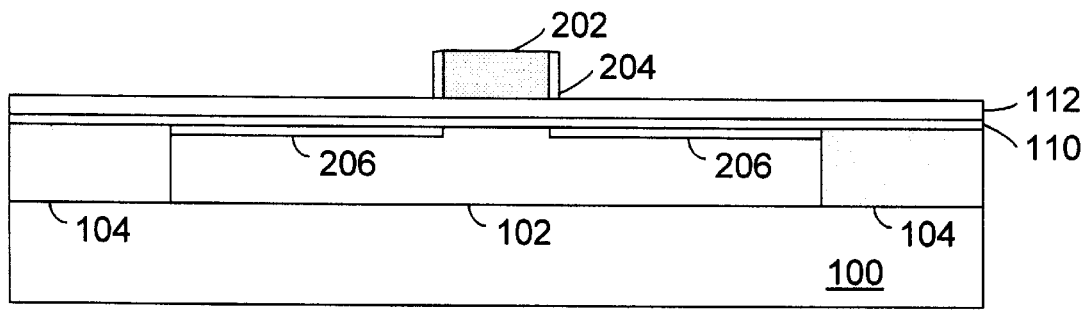

FIG. 2B illustrates the substrate 100 after the patterned mask 116 has been fully removed, a lightly doped drain (LDD) layer 206 has been implanted into the active region 102 and thin spacers 204 have been formed about the gate conductor 202. The LDD layer 206 is formed in an implant step using a dopant selected based upon the type of transistor to be formed. For example, where the active region 102 is p-type, an n-channel transistor will be formed in the active region 102. In such case, arsenic may be used to form the n-type LDD layer 206 in an implant step. Alternately, when the active region 102 is n-type, a p-channel transistor will be formed in the active region 102. In such case, boron may be employed to form the p-type LDD layer 206 in the active region 102 in an implant step. The thin spacers 206 are formed using a known technique, such technique being the well known TEOS technique in the present embodiment.

Figure 2C:
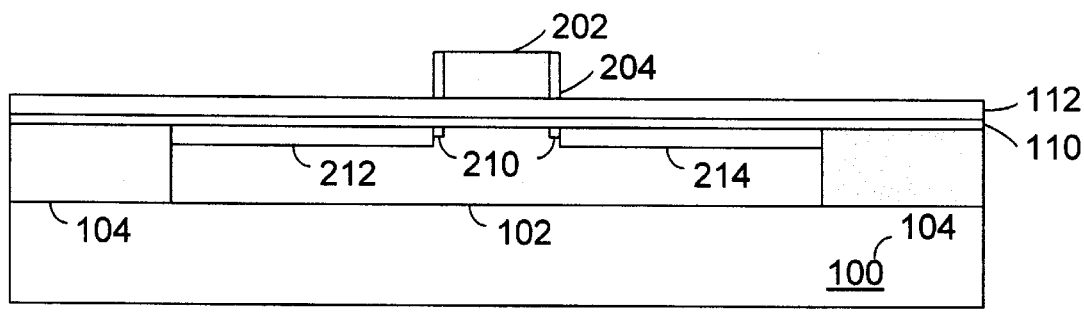

Referring now to FIG. 2C, the substrate is shown after source 212 and drain 214 implants are formed. As is shown, the source 212 and drain 214 implants overtake the LDD layer 206 such that only LDD regions 210 remain. For an n-channel device formed in a p-type active region 102, arsenic may be used in an implant step to form the source 212 and drain 214 implants. Further, in the case of a p-channel device formed in an n-type active region 102, boron may be used in an implant step to form the source 212 and drain 214 implants.

As is the case with both the LDD layer 206 and the source 212 and drain 214 implants, appropriate implant energies and doses must be selected so that the implants are formed at a desired depth and at a desired concentration. Techniques for determining such energies and doses are typically known in the art and are not described further herein. As is apparent, the combination of forming the LDD layer 206 and the source 212 and drain 214 implants substantially dopes the gate conductor 202.

Figure 2D:
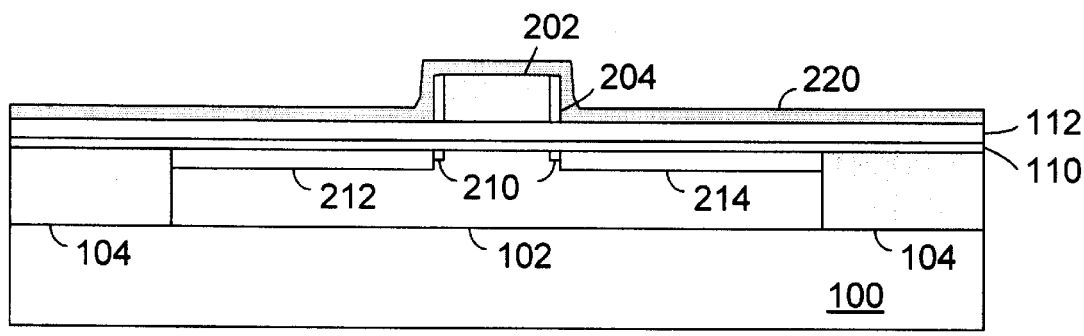

FIG. 2D illustrates the substrate 100 after a silicidation metal layer 220 is conformally deposited across the surface of the substrate. In the described embodiment, cobalt is deposited across the surface of the substrate 100 (upon the gate conductor 202, thin spacers 204 and nitride layer 112) to a depth of approximately 750 Angstroms to form the silicidation metal layer 220.

Figure 3A:
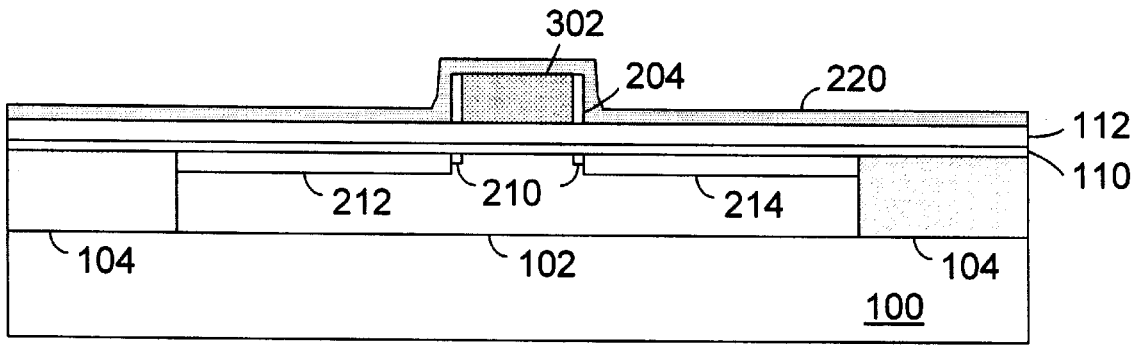
FIGS. 3A through 3D are additional partial cross-sectional views of the semiconductor substrate of FIGS. 1A through 1D and 2A through 2D during the formation of the transistor according to present invention.

FIGS. 3A through 3D are additional partial cross-sectional views of the semiconductor substrate of FIGS. 1A through 1D and FIGS. 2A through 2D during the formation of the transistor according to present invention. Referring now to FIG. 3A, the substrate 100 is shown after it has been subjected to a rapid thermal annealing (RTA) step at a temperature in the range of 600 to 800 degrees Celsius for a period of 30 to 60 second in a pure nitrogen environment. This RTA step reacts the silicidation metal layer 220 with the gate conductor 202 to form a silicide gate conductor 302 having a relatively low bulk resistance as compared to the bulk resistance of the unconverted polysilicon gate conductor 202. Subsequently, the remaining portion of the silicidation metal layer 220 is stripped in an RCA step to expose nitride layer 112, the silicide gate conductor 302 and the thin spacers 204. Such well-known RCA step may employ a wet solution with a 7:1:1 mixture of $H_2O$, $H_2O_2$ and $H_2SO_4$, respectively, in stripping the remaining silicidation metal layer 220.

Figure 3B:
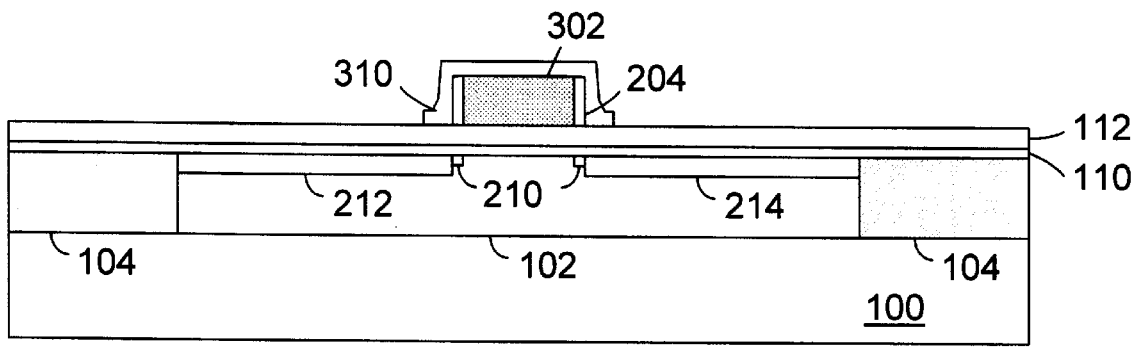
Figure 3C:
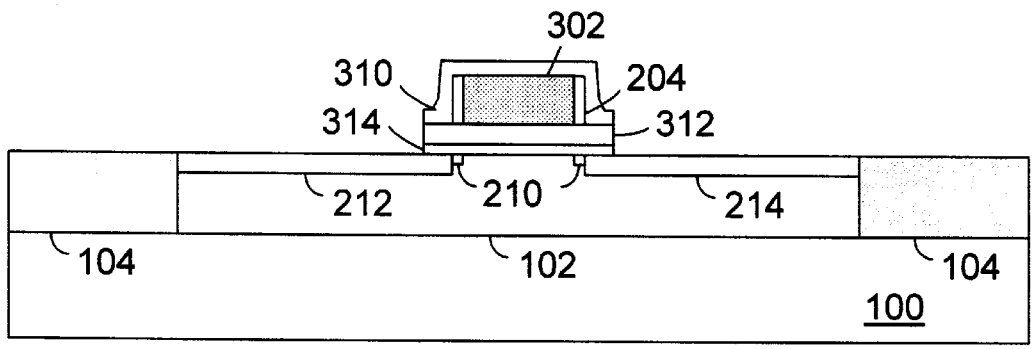
Figure 3D:
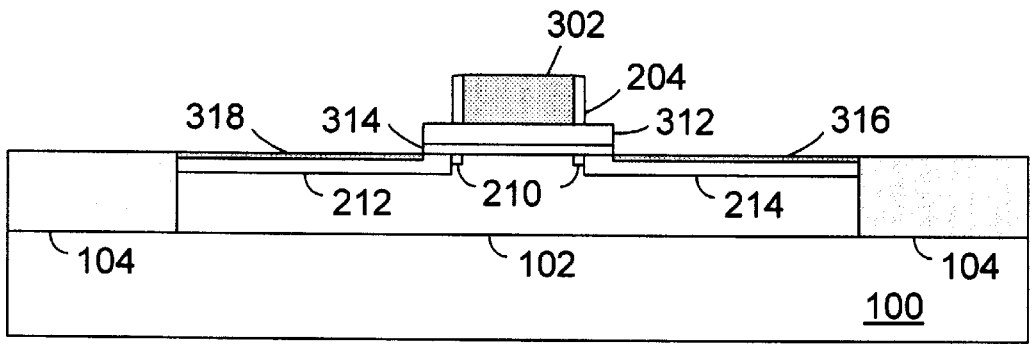

Referring now to FIG. 3B, a patterned mask 310 is formed to protect the silicide gate conductor 302 and thin spacers. Such patterned mask 310 is formed using standard photoresist application and patterning steps. Then, as shown in FIG. 3C, portions of the nitride layer 112 and oxide layer 110 unprotected by the patterned mask 310 are etched away to expose the source 212 and drain 214 regions of the transistor. A further salicide (Self Aligned Silicide) step is then performed to convert a shallow layer of the source 212 and drain 214 regions to a silicide. Such step is well known in the art. The resulting structure is illustrated in FIG. 3D.

FIGS. 4A through 4D are additional partial cross-sectional views of the semiconductor substrate of FIGS. 1A through 1D and FIGS. 2A through 2D during the formation of the transistor according to an alternate embodiment of the present invention. Referring now to FIG. 4, the substrate 100 is shown to have a silicidation metal layer 400 formed thereupon after it has been reacted with the substrate 100 components in an RTA step. As compared to the prior described embodiment, the silicidation metal layer 400 is formed of titanium instead of cobalt. Titanium is employed in this embodiment because it is capable of reacting through the nitride layer 112 and the oxide layer 110 to form silicide layers in the source and drain.

Figure 4A:
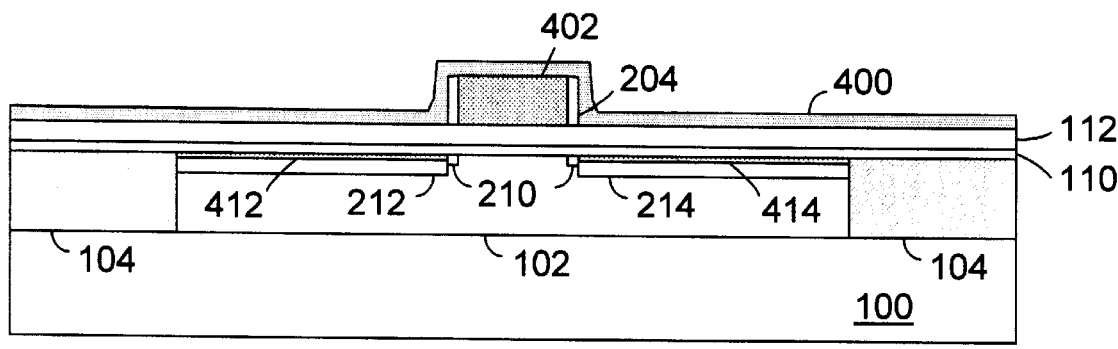
FIGS. 4A through 4D are additional partial cross-sectional views of the semiconductor substrate of FIGS. 1A through 1D and 2A through 2D during the formation of the transistor according to an alternate embodiment of the present invention.

In the embodiment of FIG. 4A, however, the combined thickness of the nitride layer 112 and the oxide layer must have an equivalent oxide thickness of no more than 10 to 20 Angstroms. With these layers formed to these equivalent thicknesses, during the RTA step, the silicidation metal layer 400 not only converts the polysilicon gate conductor to a silicide gate conductor 402 but forms a thin silicide layer 412 upon the source region 212 and a thin silicide layer 414 upon the drain region. Because the nitride layer 112 and the oxide layer 110 remained as barriers during the converting RTA step, the silicidation of the gate conductor is complete while only thin silicidation layers 412 and 414 are formed upon the source region 412 and drain region 414, respectively.

Figure 4B:
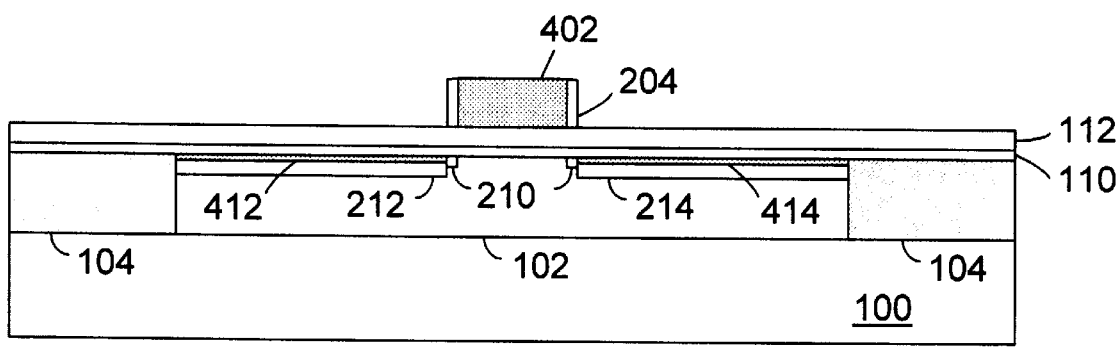
Figure 4C:
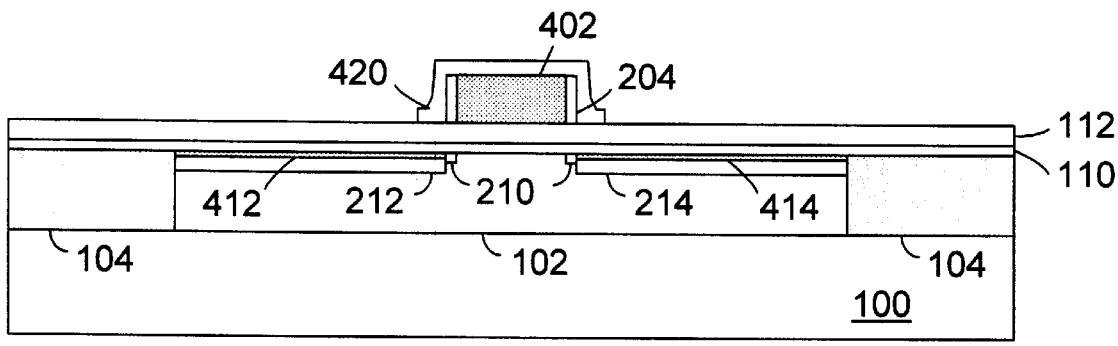
Figure 4D:
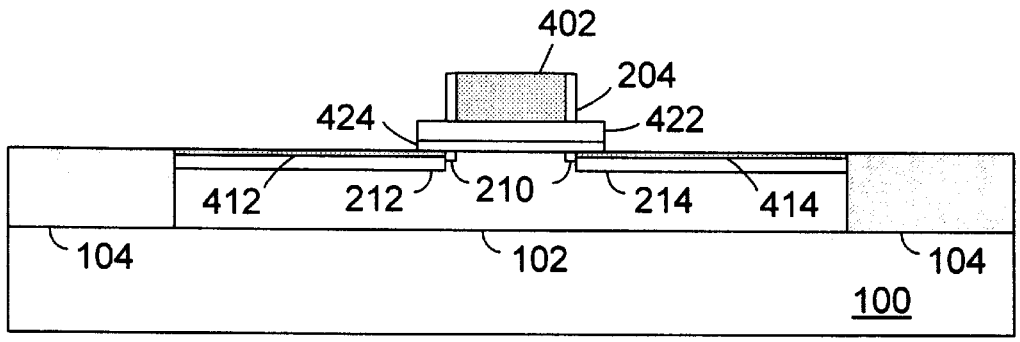

FIG. 4B illustrates the substrate after the remaining portions of the silicidation metal layer 112 are removed in an RCA step. FIG. 4C illustrates the substrate after a patterned mask 420 has be formed upon the gate conductor 402 and thin spacers 204. Finally, FIG. 4D illustrates the substrate 100 after portions of the nitride layer 112 and the oxide layer 110 that were unprotected by the patterned mask 420 have been etched away and the patterned mask 420 has been removed. These steps were described in more detail with reference to FIGS. 3B through 3D and are not discussed in detail here again. In an alternate embodiment, vias are formed through the nitride layer 112 and the oxide layer to the source 212 and drain 214.

Figure 5:
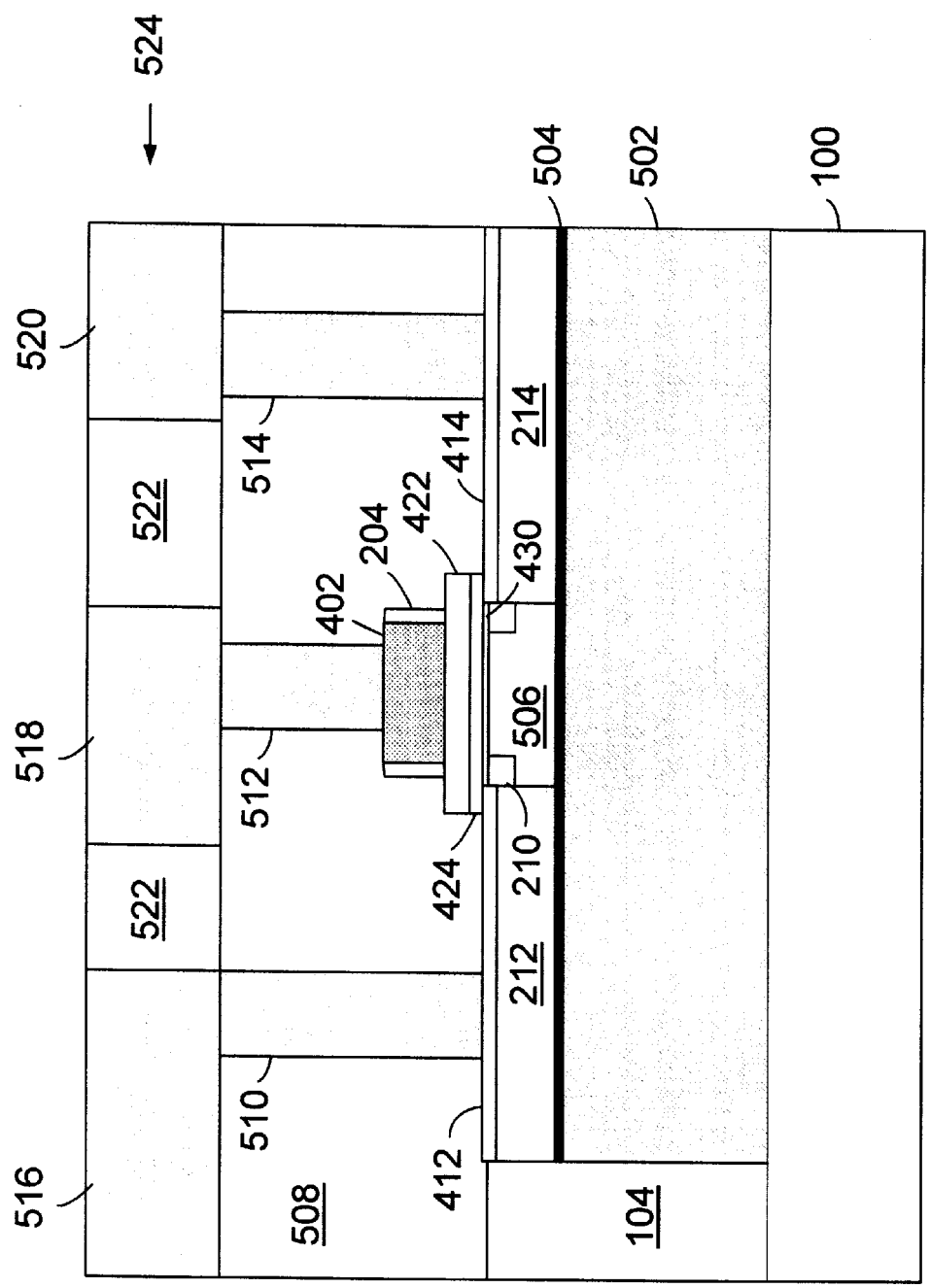
FIG. 5 is a partial cross sectional diagram of a transistor that has been formed according to the present invention that illustrates the components of the transistor and how the transistor can be connected to other transistors to form an integrated circuit.

FIG. 5 is a partial cross-sectional diagram of a transistor that has been formed according to the present invention that illustrates the components of the transistor and how the transistor can be connected to other transistors to form an integrated circuit. Referring now to FIG. 5, a well 502 has been formed and a punch through region 504 has been formed. Further the transistor has been interconnected with other active devices to form an integrated circuit. FIG. 5 also illustrates a $V_T$ region 430 formed within a channel 506 which resides below the gate stack. Further shown in FIG. 5 are the salicidation regions 412 and 414 of the source region 212 and drain region 214, respectively. Silicide gate conductor 402, thin spacers 204, nitride layer 422 and oxide layer 424 gate insulators are also shown.

FIG. 5 also illustrates an insulation layer 508 which is formed to isolate active devices from a metallization layer 524 that is used to interconnect active devices. While only a single active device is shown, literally millions of active devices are typically formed in an integrated circuit, some or all of the active devices formed according to the present invention. As is known in the art, the insulation layer 508 may be formed in a plurality of different ways. In one embodiment of the invention, the insulation layer 508 is formed in a CVD process to thickness that is required to isolate the metallization layer 524 from the active devices of the integrated circuit. Typically, the insulation layer 508 is polished in a CMP process to form a planar upper surface. It is then masked and etched to form openings to the active regions (e.g., source 212, gate conductor 402 and drain 214) of the device.

Once the openings are formed, a sputtering or evaporation process, by way of example, is used to fill the vias with a metal. The resulting metallized vias 510, 512 and 514 result. Metals that can be used in this process include Ti, TiN, W and Al. Once metallization layer 524 is added, it is masked to form a conductor pattern and the surface is etched back to the insulation layer 508 to form the conductors 516, 518 and 520. An insulator layer 522 may be formed to isolate conductive paths 516, 518 and 520 formed in the metallization layer 524, particularly if a subsequent metallization layer is formed upon the metallization layer 524. Subsequent metallization layers (not shown) can provide further interconnections among the devices and external to the formed integrated circuit.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. A method for forming a transistor on a semiconductor substrate, the method comprising:

forming an oxide layer upon the substrate;

removing a partial thickness of the oxide layer;

depositing a nitride layer upon the oxide layer;

forming a silicon gate conductor upon the nitride layer;

implanting a dopant into the substrate to form a lightly doped drain layer within the substrate below the oxide layer and adjacent the silicon gate conductor, forming spacers about the silicon gate conductor;

implanting a dopant within the substrate to form source and drain regions within the substrate, to form lightly doped drain regions below the spacers within the substrate, and to substantially dope the silicon gate conductor;

forming a silicide metal layer upon the silicon gate conductor and the nitride layer;

converting the silicon gate conductor into a silicide gate conductor by reacting the silicide metal layer with the silicon gate conductor;

removing remaining portions of the silicide metal layer; and removing at least a portion of the oxide layer and the nitride layer above the source and drain regions.

2. The method of claim 1, wherein the silicide metal layer is cobalt.

3. The method of claim 1, wherein the oxide layer has a thickness of between 3 and 5 Angstroms.

4. The method of claim 3, wherein the nitride layer has a thickness of between 10 and 20 Angstroms.

5. The method of claim 1, further comprising annealing the nitride layer and the oxide layer prior to forming the silicon gate conductor upon the nitride layer.

6. The method of claim 1, wherein removing at least a portion of the oxide layer and the nitride layer above the source and drain regions comprises:

forming a patterned mask such that the patterned mask protects the silicon gate conductor, the spacers and portions of the nitride layer residing adjacent the silicon gate conductor and spacers;

performing an etch step to remove unprotected portions of the nitride layer and oxide layer; and removing the patterned mask to expose the silicon gate conductor the spacers and portions of the nitride layer adjacent the silicon gate conductor and spacers, wherein the portions of the nitride layer residing adjacent the silicon gate conductor and portions of the oxide layer residing underneath provide additional insulation between the silicon gate conductor and the source and drain regions.

7. The method of claim 1, further comprising forming a voltage threshold region.

8. The method of claim 1, further comprising forming silicide regions in the source/drain regions.

9. The method of claim 8, wherein the silicide regions in the source/drain regions are formed after removing at least a portion of the oxide layer and the nitride layer above the source and drain regions.

10. The method of claim 9, wherein:

the silicide metal layer comprises titanium; and the combined thickness of the oxide layer and the nitride layer is less than 10 to 20 Angstroms of equivalent thickness of silicon dioxide.

11. The method of claim 1, wherein a rapid thermal annealing step is employed to convert the silicon gate conductor into a silicide gate conductor by reacting the silicide metal layer with the silicon gate conductor.

12. The method of claim 1, further comprising:

forming a plurality of transistors according to the prior described steps; and interconnecting the plurality of transistors to form an integrated circuit.

\* \* \* \* \*